US006563144B2

(12) United States Patent
Weber et al.

(10) Patent No.: US 6,563,144 B2
(45) Date of Patent: May 13, 2003

(54) PROCESS FOR GROWING EPITAXIAL GALLIUM NITRIDE AND COMPOSITE WAFERS

(75) Inventors: Eicke R. Weber, Oakland, CA (US); Sudhir G. Subramanya, Fremont, CA (US); Yihwan Kim, San Mateo, CA (US); Joachim Kruger, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/824,843

(22) Filed: Apr. 2, 2001

(65) Prior Publication Data

US 2002/0005566 A1 Jan. 17, 2002

Related U.S. Application Data

(60) Provisional application No. 60/152,020, filed on Sep. 1, 1999.

(51) Int. Cl.$^7$ .............................................. H01L 31/072
(52) U.S. Cl. ..................... 257/190; 257/94; 257/103; 257/615; 438/46; 438/47; 438/767; 438/938
(58) Field of Search ......................... 257/94, 103, 190, 257/615; 438/46, 47, 767, 938

(56) References Cited

U.S. PATENT DOCUMENTS

| | | | |
|---|---|---|---|
| 5,290,393 A | | 3/1994 | Nakamura et al. |
| 5,369,289 A | | 11/1994 | Tamaki et al. |
| 5,578,839 A | | 11/1996 | Nakamura et al. |
| 5,670,798 A | * | 9/1997 | Schetzina ..................... 257/96 |
| 5,767,581 A | | 6/1998 | Nakamura et al. |
| 6,013,937 A | | 1/2000 | Beintner et al. |
| 6,133,589 A | | 10/2000 | Krames et al. |
| 6,345,063 B1 | * | 2/2002 | Bour et al. ..................... 372/45 |
| 6,359,919 B1 | * | 3/2002 | Ishikawa et al. ............... 372/45 |

FOREIGN PATENT DOCUMENTS

JP     10326940 A   * 12/1998

OTHER PUBLICATIONS

Nakamura et al., Jpn. J. Appl. Phys., vol. 34, p. L797–L799, (1995).
Amano, H. et al., Jpn. J. Appl. Phys., vol. 28, p. L2112–2114, (1989).
Nakamura, S. et al., Jpn. J. Appl. Phys., vol. 31, p. L139–L142, (1992).
Sudhir, G.S. et al., Mat. Res. Symp. Proc., vol. 482, p. 525–530, (1998).
Kim, Y. et al., Mat. Res. Symp. Proc., vol. 482, p. 217–222, (1998).
Krueger, J. et al., Mat. Res. Symp. Proc., vol. 482, p. 447–452, (1998).
Anders, A. et al., Plasma Sources Sci. Technol., vol. 4, p. 571–575, (1995).
NG, H.M. et al., Mat. Res. Symp. Proc., vol. 482, p. 507–512, (1998).
Kisielowski, C. et al., Jpn. J. Appl. Phys., Part 1, vol. 36, p. 6932–6936, (1997).
Cho, Y. et al., Mat. Res. Symp. Proc., vol. 482, p. 45–50, (1998).
Mohammed, S.N. et al., Prog. Quant. Electr., vol. 20, No. 5/6, p. 361–362, p. 418–419, (1996).

* cited by examiner

Primary Examiner—Nathan J. Flynn
Assistant Examiner—Remmon R. Fordé
(74) Attorney, Agent, or Firm—Charles Nold

(57) ABSTRACT

A novel growth procedure to grow epitaxial Group III metal nitride thin films on lattice-mismatched substrates is proposed. Demonstrated are the quality improvement of epitaxial GaN layers using a pure metallic Ga buffer layer on c-plane sapphire substrate. X-ray rocking curve results indicate that the layers had excellent structural properties. The electron Hall mobility increases to an outstandingly high value of $\mu > 400$ cm$^2$/Vs for an electron background concentration of $4\times10^{17}$ cm$^{-3}$.

8 Claims, 5 Drawing Sheets

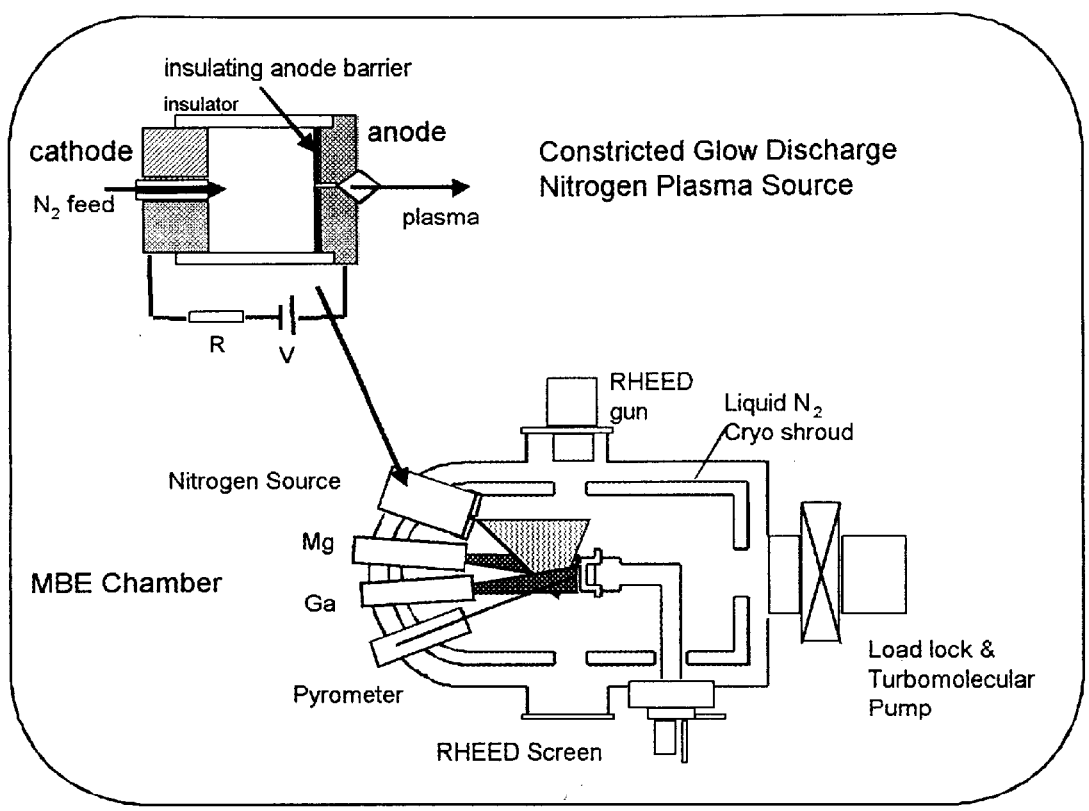
Figure 1: A schematic of an MBE system with nitrogen plasma source.
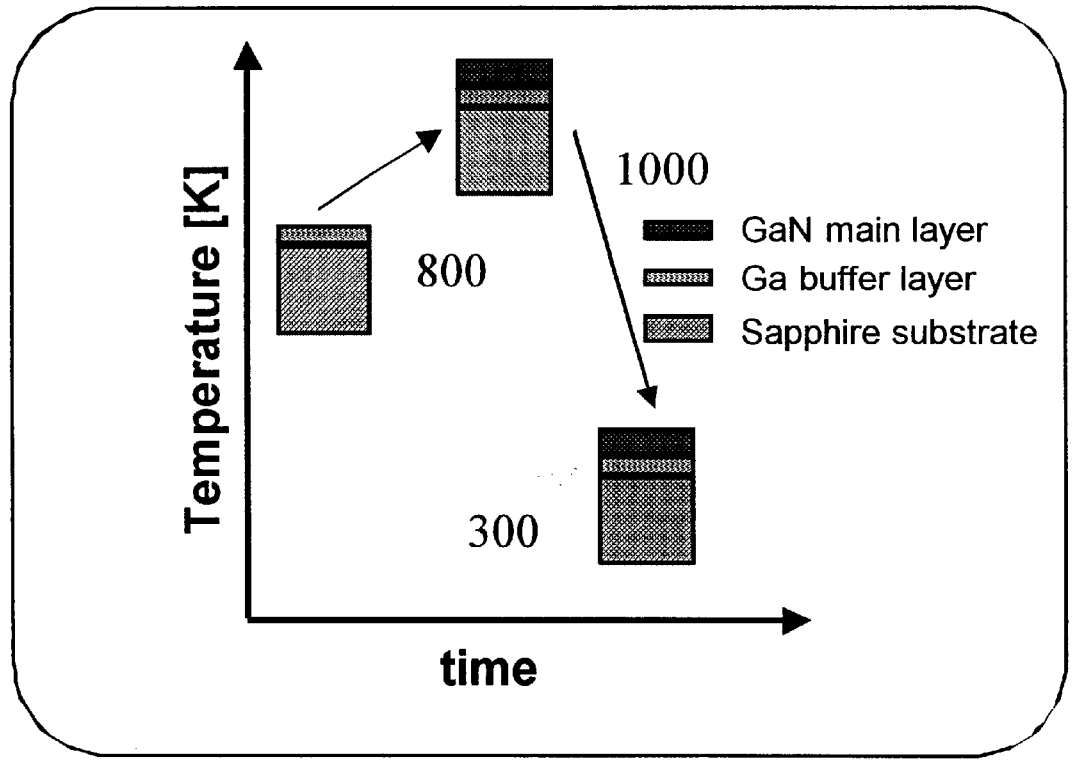
Figure 2: A schematic of the growth process.

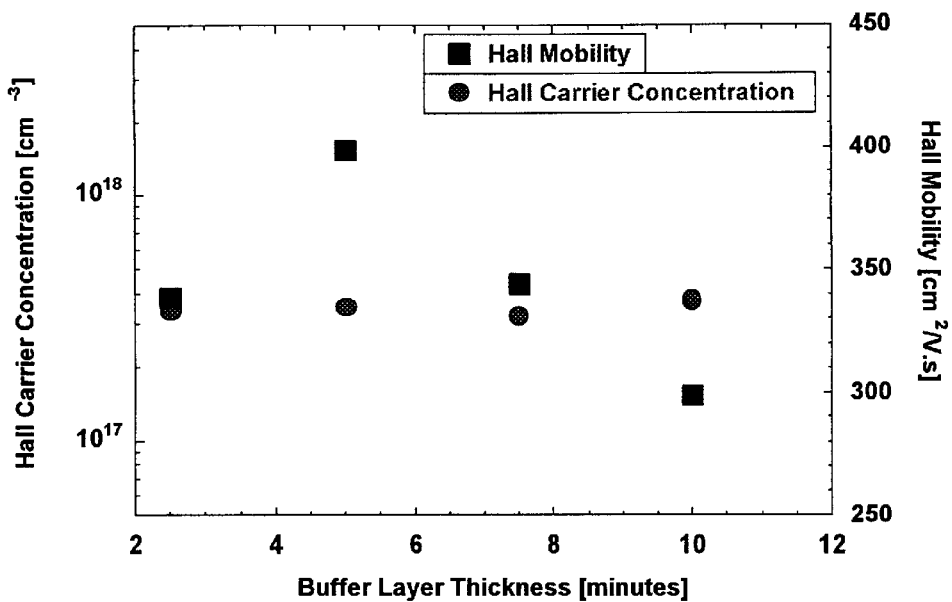
Figure 3: Buffer layer thickness versus room-temperature Hall carrier concentration and mobility
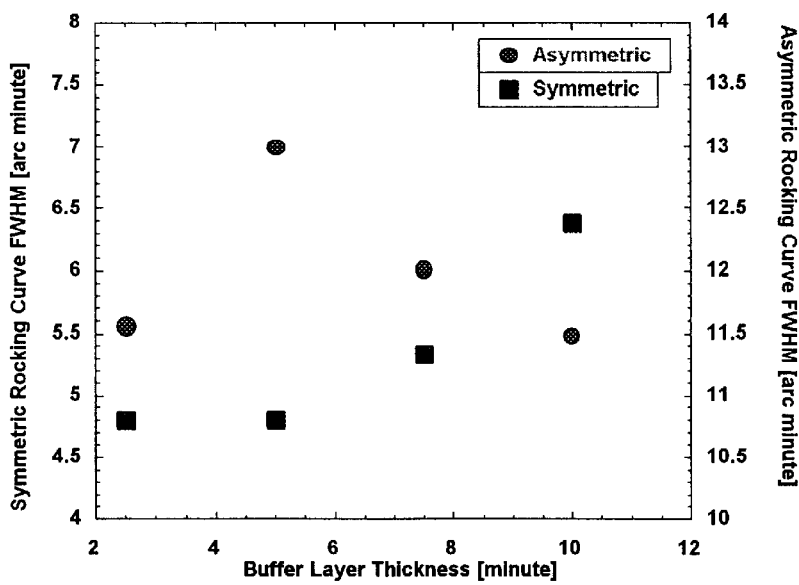
Figure 4: X-ray rocking curve FWHM as a function of buffer layer thickness.

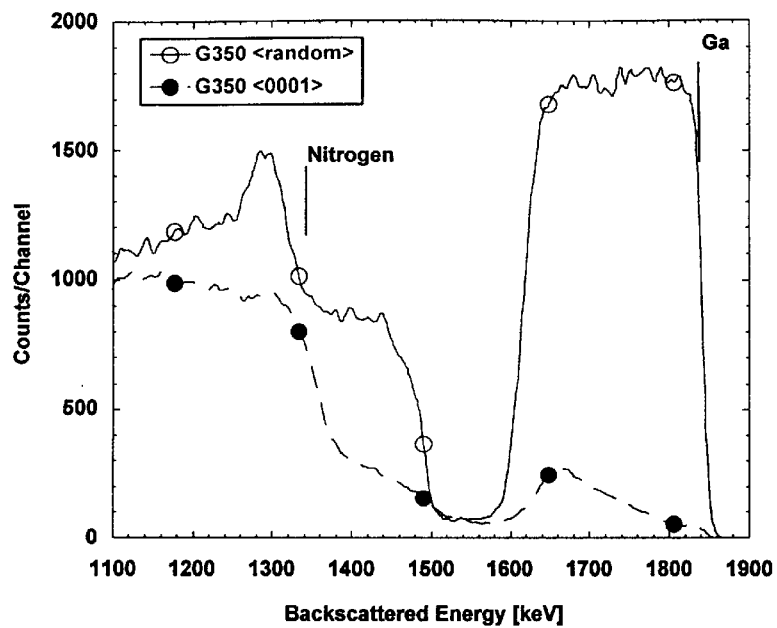
Figure 5: RBS with channeling of GaN thin film on sapphire.
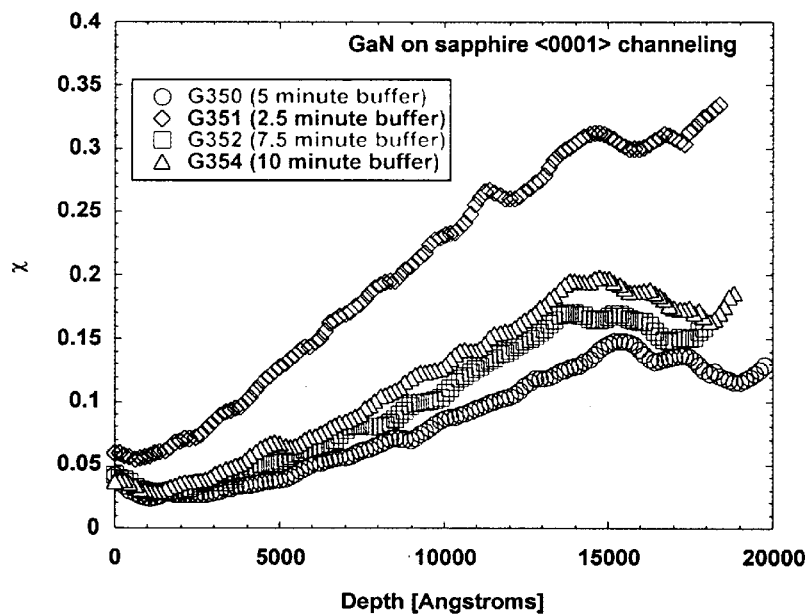
Figure 6: The variation of the channeling yield c with depth for different buffer layer thickness.

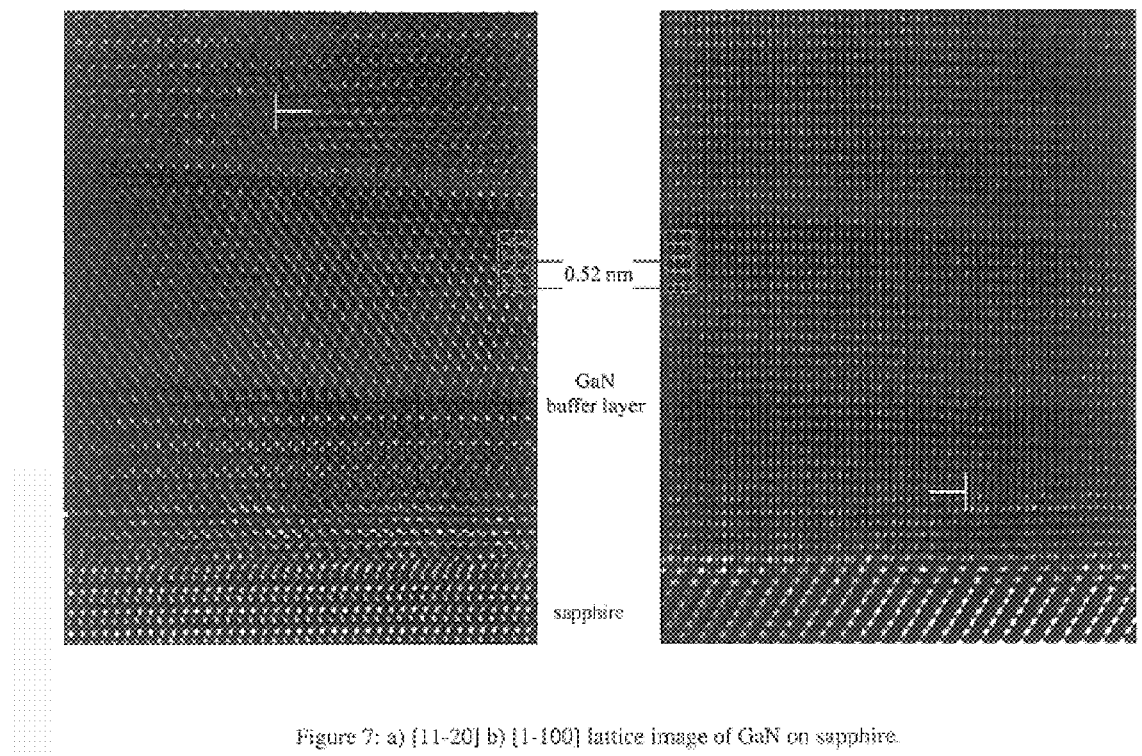
Figure 7: a) [11-20] b) [1-100] lattice image of GaN on sapphire.

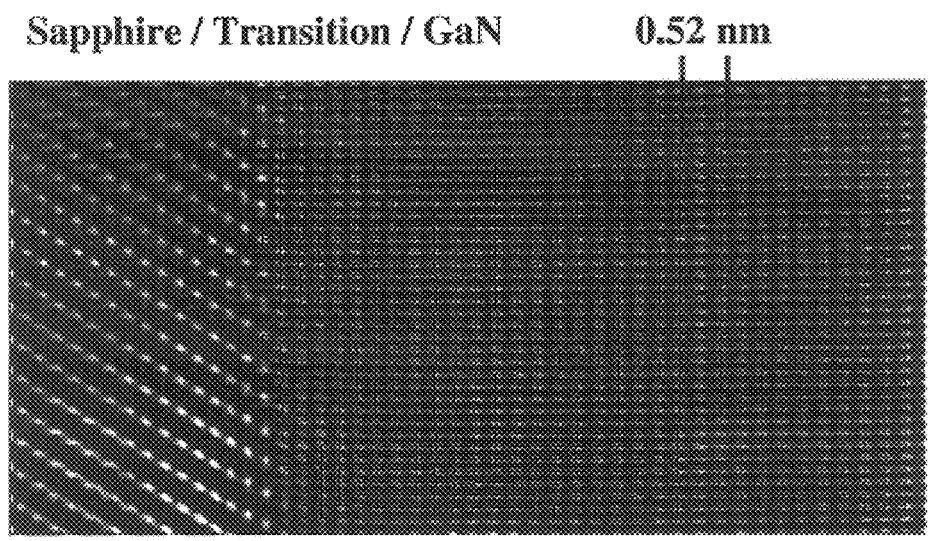
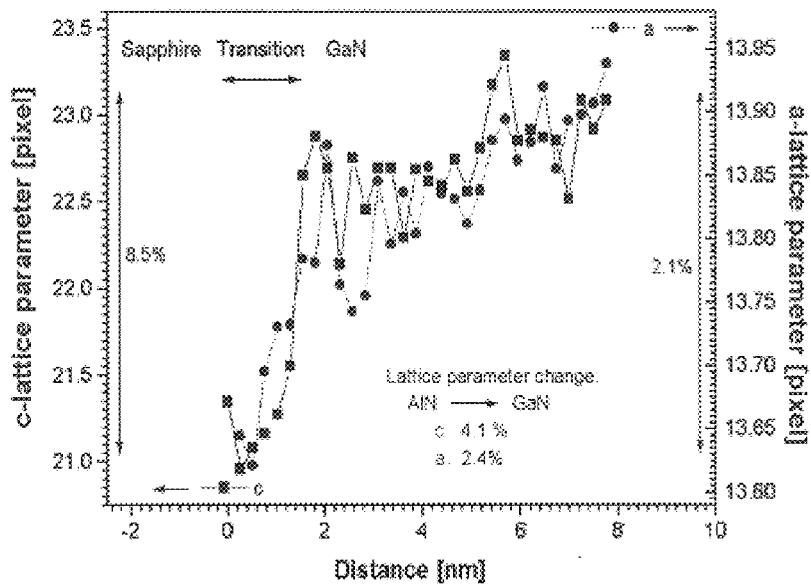
Figure 8: a) [11-20] lattice image of GaN on sapphire. The grid show the unit cells. b) shows a plot of a- and c-lattice parameter as a function of distance from interface.

PROCESS FOR GROWING EPITAXIAL GALLIUM NITRIDE AND COMPOSITE WAFERS

This application claims the benefit of Provisional application Ser. No. 60/152,020, filed Sep. 1, 1999.

STATEMENT REGARDING FEDERALLY SPONSORED RESEARCH OR DEVELOPMENT

This invention was made with government support under Grant (Contract) No. DE-AC03-76F00098 awarded by The United States Department of Energy. The government has certain rights to this invention.

BACKGROUND OF THE INVENTION

Recently, there has been enormous interest in growth of Group III nitride, and particularly gallium nitride (GaN) thin films, Jpn. J. Appl. Phys. Vol. 34 (1995) pp. L 797–L 799. GaN, and related (Aluminum, Indium)N alloys are being utilized for the production of efficient optoelectronic devices, e.g. light emitters and detectors spanning the spectral range of visible to deep ultra-violet (UV). In addition, the direct wide bandgap and the chemical stability of Group III nitrides are very beneficial for high-temperature and high-power operated electronic devices, e.g. hetero-junction bipolar and field effect transistors. However, the poor material quality of GaN severely limits the efficiency of such devices.

When GaN is directly grown on a sapphire substrate, the growth mode is three-dimensional due to the large lattice mismatch, the chemical dissimilarity, and the thermal expansion difference. The layer contains structural defects such as point defects, misfit dislocations, and stacking faults. These defects degrade the film's structural, morphological, and electronic properties. In order to achieve high quality epitaxial growth, researchers have introduced a thin low-temperature grown AlN or GaN layer serving as a buffer layer. This layer provides nucleation sites for subsequent two-dimensional GaN growth at higher temperatures, see H. Amano, M. Kito, K. Hiramatsu, and I. Akasaki, Jpn. J. Appl. Phys. 28, L2112 (1989) and S. Nakamura, T. Mukai, M. Senoh, and N. Isawa, Jpn. J. Appl. Phys. 31, L139 (1992). Therefore, the control of buffer layer growth is the most important step in the improvement of GaN main layer properties. The effect of buffer layer thickness and growth temperature on GaN main layer properties has been well studied: G. S. Sudhir, Y. Peyrot, J. Krüger, Y. Kim, R. Klockenbrink, C. Kisielowski, M. D. Rubin and E. R. Weber, Mat. Res. Symp. Proc. 482, pp. 525–530 (1998); Y. Kim, R. Klockenbrink, C. Kisielowski, J. Krüger, D. Corlatan, Sudhir G. S., Y. Peyrot, Y. Cho, M. Rubin, and E. R. Weber, Mat. Res. Symp. Proc. 482, pp. 217–222 (1998); J. Krüger, Sudhir G. S., D. Corlatan, Y. Cho, Y. Kim, R. Klockenbrink, S. Rouvimov, Z. Liliental-Weber, C. Kisielowski, M. Rubin and E. R. Weber, Mat. Res. Symp. Proc. 482 pp. 447–452 (1998). Buffer layers for Group-III nitride growth has been discussed in Mohammad et al., "Progress and Prospects of Group-III Nitride Semiconductors", Prog. Quant. Electr. 1996, Vol. 20, No. 5/6 pp. 418–419, hereby incorporated by reference in its entirety. Various buffer materials are disclosed. Not disclosed or fairly suggested is gallium metal.

Group III nitride semiconductors are discussed generally in Mohammad et al., "Progress and Prospects of Group-Ill Nitride Semiconductors", Prog. Quant. Electr. 1996, Vol. 20, No. 5/6 pp. 361–525, the contents of which are hereby incorporated in its entirety.

Other U.S. Patents relevant to the state of the art include U.S. Pat. Nos. 5,369,289; 6,133,589; 5,767,581; 6,013,937; 5,578,839 and 5,290,393. U.S. Pat. No. 5,369,289 discloses a gallium nitride based compound semiconductor light emitting device comprising a buffer layer of a gallium nitride compound. U.S. Pat. No. 6,133,589 discloses an AlGaInN based light emitting diode having a buffer layer comprising a AlFaInN-based material. U.S. Pat. No. 5,767,581 discloses a gallium nitride based III–V group compound semiconductor having an ohmic electrode comprising a metallic material. U.S. Pat. No. 6,013,937 discloses a silicon wafer having a buffer layer formed on the dielectric layer. U.S. Pat. No. 5,578,839 discloses a gallium nitride based compound semiconductor device. U.S. Pat. No. 5,290,393 discloses a gallium nitride based compound semiconductor having a buffer layer of GaAlN. The above mentioned references and U.S. Patents are hereby incorporated into this specification in their entirety.

In this work, we propose a novel growth procedure to grow high quality epitaxial Group III metal nitrides, particulary GaN thin films on lattice-mismatched substrates. In contrast to all other prior art, we are using a pure metallic Group III metal layer serving as a buffer layer. The resulting main layer exhibits superior structural and electrical properties.

BRIEF SUMMARY OF THE INVENTION

The present invention relates to a process for growing an epitaxial metal nitride on a substrate, and to the metal nitride wafers made by the process. More particularly, it relates to a process for growing an epitaxial metal nitride on a lattice mismatched substrate in which a buffer layer of a Group III metal is deposited on the lattice mismatched substrate, and a Group III metal nitride thin film is thereafter grown on top of the buffer layer. The invention also relates to metal nitride semiconductor wafers each of which is a composite comprising a substrate, a buffer layer of a metal overlying the surface of the substrate, and a top layer of an epitaxial metal nitride thin film.

The invention contemplates that any Group III metal is sufficient to accomplish the purpose of this invention. Preferred is an aluminum or gallium metal. Particularly preferred is gallium.

BRIEF DESCRIPTION OF THE FIGURES

FIG. 1 is a schematic diagram of a MBE system with a nitrogen plasma source.

FIG. 2 is a schematic diagram of the growth process illustrated by this invention.

FIG. 3 is a chart showing the buffer layer thickness versus room-temperature Hall carrier concentration and mobility.

FIG. 4 is a chart showing an X-ray rockng curve FWHM as a function of buffer layer thickness.

FIG. 5 is a chart of RBS with channeling of GAN thin film on sapphire.

FIG. 6 is a chart showing the variation of the channeling yield "c" with depth for different buffer layer thickness.

FIG. 7 is a micrograph a) [11–20] b)[1–100] lattice image of GaN on sapphire.

FIG. 8 is a micrograph a) [11–20] lattice image of GaN on sapphire. The grid shows the unit cells. b) shows a plot of a- and c-lattice parameters as a function of distance from interface.

DETAILED DESCRIPTION OF THE INVENTION

A novel growth procedure to grow epitaxial Group III nitride thin films on lattice-mismatched substrates is proposed. We demonstrate the quality improvement of epitaxial GaN layers using a pure metallic Ga buffer layer on c-plane sapphire substrate. X-Ray rocking curve results indicate that the layers had excellent structural properties. The electron Hall mobility increases to an outstanding value of $\mu>400$ cm$^2$/Vs for an electron background concentration of $4\times10^{17}$ cm$^{-3}$. Cross sectional high-resolution transmission electron microscopy of the thin films shows the interface to be sharp. Strain mapping of the interface depicts a transition from AlN lattice parameters to GaN lattice parameters. The buffer layer region contains line defects and stacking faults but no precipitation of metallic Ga is observed.

In particular the invention described herein discloses a process for growing Group III metal nitride thin films on a substrate which comprises:

a) selecting a substrate, b) coating said substrate with a buffer layer of a Group III metal, c) growing an epitaxial layer of a Group III metal nitride on the surface of said buffer layer.

Also described herein is a Group III metal nitride composite wafer comprising a) a substrate, b) a buffer layer of Group m metal overlying and bonded to said substrate, c) a Group III metal nitride thin film overlying and bonded to said buffer layer.

A Group III metal is defined as scandium, yttrium, aluminum, gallium, indium or thallium. A Group III metal nitride is a nitride of a Group III metal. Group III nitrides are discussed extensively in Mohammad et al., "Progress and Prospects of Group-III Nitride Semiconductors", *Prog. Quant. Electr.* 1996, Vol. 20, No. 5/6 pp. 361–525, hereby incorporated by reference in its entirety. Preferred is either indium, aluminum or gallium nitride. Particularly preferred is gallium nitride, GaN.

The backside of the substrate is defined as that side that is opposite the side having the metal buffer layer thereon.

Substrate is meant to include substrates of sapphire, SiC, [Si or Ga]As, and others suitable for Group III nitride growth. These are discussed in Mohammad et al., "Progress and Prospects of Group-III Nitride Semiconductors", *Prog. Quant. Electr.* 1996, Vol. 20, No. 5/6 pp. 415–419, hereby incorporated by reference in its entirety.

The process of this invention can be understood with reference to FIGS. 1 and 2. GaN layers were grown using a molecular beam epitaxy (MBE) system (see FIG. 1). Knudsen cells were used to evaporate elemental Ga and Si while the activated nitrogen was produced by a Constricted Glow Discharge (CGD) plasma source developed at Lawrence Berkeley National Laboratory with pure nitrogen gas (99.9995%). The glow discharge generated by a dc voltage was constricted to a small anode area in the plasma chamber close to the gas exit. It is the pressure difference between the plasma chamber and the MBE growth chamber that extracts the activated nitrogen species with kinetic energies less than 3 eV. A liquid nitrogen cryoshroud was used during growth to obtain a base pressure in the chamber of $\sim2\times10^{-10}$ Torr. A thin titanium (Ti) layer (approximately 800 nm thickness) was coated on the back of the 10×11 mm$^2$ c-plane sapphire substrate in order to increase heat absorption by radiation from the tungsten filament heater. The temperature of the substrate was monitored using a pyrometer.

Prior to growth, the substrate was degreased by boiling in acetone and ethyl alcohol for 5 minutes each and dried by blowing nitrogen gas. After degassing in the load lock for 30 min at approximately 773K, it was transferred into the growth chamber. A schematic of the growth process is given in FIG. 2. The substrate was then heated up to approximately 973K for thermal desorption of surface contaminants. At this temperature, it was exposed for nitridation with activated nitrogen for 10 minutes. Subsequently, a thin pure metallic Ga buffer layer was deposited at approximately 800K. Then, this buffer layer was heated up to the growth temperature of approximately 1000K under further nitridation. Finally, the main epitaxial layer was grown for 4 hours at approximately 1000K. The resulting thickness of the GaN main layer was $\sim2$ µm. During the growth, the nitrogen partial-pressure in the chamber was in the range of $10^{-5}$ to $10^{-4}$ Torr.

The structural properties were analyzed with a Siemens D5000 x-ray diffractometer. The electrical properties of thin films were characterized by Hall-effect measurements. Rutherford backscattering (RBS) with channeling was used to monitor the structural quality and composition as a function of depth.

FIG. 3 shows the room-temperature Hall carrier concentration and mobility of the GaN main layer as a function of buffer layer thickness, which was varied by the exposure time of a constant Ga-flux to the substrate. Apparently, the carrier mobility goes through a maximum $\mu>400$ cm$^2$/Vs for a buffer layer thickness of 5 minutes growth time. However, the carrier concentration was found to be a constant at $4\times10^{17}$ cm$^{-3}$ and is therefore not responsible for the change in mobility. A carrier mobility value of $\mu>400$ cm$^2$/Vs is outstanding compared to other reported values for MBE grown main layers. The change in Hall mobility as a function of buffer layer thickness excludes that parts of the carrier conduction processes take place in the buffer layer since one would otherwise expect a monotonous increase in the Hall mobility. It rather indicates a change of the main layers' structural properties due to different buffer layer thickness.

This effect of buffer layer thickness is also reflected on the crystalline quality of the main layers, as probed by x-ray diffraction and Rutherford backscattering spectroscopy. The variation of symmetric and asymmetric x-ray rocking curve full width at half maximum (FWHM) with buffer layer thickness is presented in FIG. 4. All main layers had a symmetric FWHM of less than 7 arc minutes and an asymmetric FWHM of less than 13 arc minutes. These values prove the high quality of these layers. As in the case of the Hall mobility, it appears that there is an optimum wetting Ga layer thickness for the crystalline quality of the main layer.

Rutherford backscattering with channeling was used to probe the GaN/sapphire interface (FIG. 5). The absence of the pure Ga peak in the profile of Ga indicates that there is no metallic Ga layer at the GaN/sapphire interface. This observation may be explained by a complete nitridation of the pure Ga layer during the growth process. Under channeling conditions the minimum channel yield is a measure of crystalline quality. FIG. 6 depicts the channel yield as a function of depth for GaN thin films with different buffer layer thickness. The crystalline quality first improves and then deteriorates with increasing buffer layer thickness exhibiting an optimum thickness at a buffer layer growth time of 5 minutes which matches with our x-ray rocking curve results and our interpretation of the Hall data.

While not wishing to be bound by any theory, the results obtained so far can be explained by the following model: The surface energy of sapphire in contact with air $\lambda_{SV}$ is 905 ergs/cm$^2$ and the surface energy of liquid metallic Ga $\lambda_{LV}$ is 718 ergs/cm$^2$. Also, the surface energy of sapphire in contact with liquid Ga is given by:

$$\lambda_{SL} \text{ at } t°C.=718-0.101(t-t_{MELTING\ POINT})\ ergs/cm^2.$$

Using these data and the equation:

$$\lambda_{LV} \cos\theta = \lambda_{SV} - \lambda_{SL},$$

the wetting angle θ of liquid Ga on sapphire at the deposition temperature of approximately 800K is calculated to be 70°. Therefore, the liquid Ga layer can be expected to wet the surface and spread well on the sapphire. Exposing this Ga layer to the nitrogen source upon heating to the GaN main layer growth temperature will provide favorable two-dimensional nucleation conditions for the subsequent growth of the GaN main layer at approximately 1000K.

The microstructure of GaN thin films deposited on sapphire was investigated by HRTEM. The lattice imaging is done along zone axis [11–20] in FIG. 7a and along zone axis [1–100] in FIG. 7b. The GaN/Al$_2$O$_3$ interface is abrupt. FIGS. 7a and 7b show presence of stacking faults in the buffer layer as shown by half plane 1. The thin films are of high quality due to the low concentration of twist and tilt dislocations at the interface (also as seen by narrow symmetric and asymmetric rocking curve width). A schematic of Ga-N bonding describes the expected difference in angle between Ga-N bond based on the imaging zone axis. One can resolve the N atom in Ga-N bond with reasonable accuracy, thereby obtain information about local strain and composition. This is depicted in FIG. 8. The techniques of accessing strain and composition gradients are described elsewhere, Kisielowski et al, Jpn. J. Appl. Phys. Vol. 36 (1997) Pt. 1, No. 11, pp. 6932–6936, hereby incorporated by reference in its entirety. Digitized lattice images are used to determine the position of each Ga-N blob of interference pattern, which defines a grid built from unit cells (See FIG. 8a). The sizes of unit cells are altered due to local strain as a result of compositional fluctuations. In FIG. 8b, the a- and c-lattice parameters in pixel units as measured in [11–20] projection is plotted against the distance from GaN/Al$_2$O$_3$ interface. It is seen that both a- and c-parameter increased as one moves away from the interface. The transition is expected to be from AlN lattice parameter to GaN lattice parameter and can be explained in following manner. The growth procedure has a nitridation step before the deposition of metallic Ga buffer layer. This step results in formation of a few mono-layers of Al$_2$O$_{3-x}$N$_x$. The nitridation step after buffer layer deposition converts mono-layers of Al$_2$O$_{3-x}$N$_x$ to AlN and Ga to GaN, where x is greater than or equal to 0, but less than 3.

We have demonstrated the improvement of heteroepitaxially grown GaN main layers using a novel growth procedure. In contrast to previously published work, we used a pure metallic Ga as a buffer layer. The significantly improved quality of the GaN main layers is reflected in their superior crystalline structure, as indicated by their narrow x-ray rocking curve width. Further, these GaN main layers exhibit a record room temperature Hall mobility of $\mu$>400 cm$^2$/Vs (for a background electron concentration of 4×10$^{17}$ cm$^{-3}$). Post growth Rutherford backscattering analysis of these layers show that the Ga buffer layers are completely nitridated. HRTEM results indicated that the buffer layer region contains line defects and stacking faults but no precipitation of metallic Ga.

It was quite unexpected to find only ⅓ of the strain in the GaN layer when we use the Ga buffer layer.

The process and wafer contemplated by the instant invention includes using a Group III metal as a buffer layer that is not the Group II nitride metal. For example, an Al buffer layer may be used with a GaN layer.

The described procedures and material improvements have been accomplished for our particular MBE growth process. Since the laid out principles are generally applicable, this concept to be beneficial for any III-nitride growth process, i.e. molecular organic chemical vapor deposition (MOCVD), hydride vapor phase epitaxy (HVPE), and related methods and modified versions thereof Some Group-III nitride growth processes are described in Mohammad et al., *Prog. Quant. Electr.* 1996, Vol. 20, No. 5/6 pp. 361–525, esp. pp. 397–419. This is because a metallic Ga buffer layer generally provides a favorable two-dimensional nucleation conditions for the subsequent growth of the GaN main layer at higher growth temperatures i.e. 1000K for MBE and 1300K for MOCVD. For example, in MOCVD or HVPE a layer of metallic Ga can be easily deposited by flow of GaCl$_3$ on a heated substrate. Also, this procedure can be transferred to other lattice mismatched substrates, which are wetted by metallic Ga.

The composite wafer of this invention is preferably made by the process described above. The wafer comprises a base or substrate, a thin buffer layer of a Group III metal overlying and bonded to the substrate, and a layer of epitaxially grown Group III metal nitride overlying and bonded to the buffer layer.

The substrate optionally can contain a layer of titanium on the backside thereof The layer of Ti is between 200 and 1200 nm thick, preferably between 700 and 1000 nm thick and more preferably about 800 nm thick. The substrate ranges from about 100 to about 400 μm thick, preferably about 300 μm thick. The Ga buffer layer is preferably applied by plasma deposition and can range from about 50 angstroms to about 400 angstroms, preferably about 200 angstroms thick. Overlying and bonded to the buffer layer is a layer of epitaxially grown GaN. This layer can range from about 0.01 μm to about 10 μm thick, more preferably is about 4 μm.

It will be appreciated by those skilled in the art that various modifications and extrapolations can be made in the process and article as described herein without departing from the spirit and scope of the invention.

We claim:

1. A Group III metal nitride composite wafer comprising, a substrate, a buffer layer of a Group III metal overlying and bonded to said substrate, and a Group III metal nitride thin film overlying and bonded to said buffer layer.

2. The composite wafer of claim 1 where the Group III metal is gallium or aluminum.

3. The composite wafer of claim 1 where the Group III metal is gallium.

4. The composite wafer of claims 1–3 wherein said substrate comprises sapphire.

5. The composite wafer of claim 4 wherein said sapphire substrate is coated on the backside thereof with titanium.

6. The composite wafer of claim 1 wherein said Group III nitride thin film ranges from about 0.01 to about 10 μm in thickness.

7. The composite wafer of claim 1 wherein said buffer layer ranges from 50 angstroms to about 400 angstroms in thickness.

8. A composite wafer comprising, a sapphire substrate, a buffer layer of metallic Ga overlying and bonded to the substrate, a Ga film overlying and bonded to the Ga buffer layer.

* * * * *